United States Patent
Mori et al.

[11] Patent Number: 6,075,936
[45] Date of Patent: Jun. 13, 2000

[54] LOGIC CIRCUIT SIMULATION APPARATUS HAVING CYCLE-BASED SIMULATOR FOR SIMULATING CIRCUITS INCLUDING MULTI-CYCLE PATHS

[75] Inventors: Hiroyuki Mori; Masahiro Taniguchi; Yoshio Inoue, all of Tokyo, Japan

[73] Assignee: Mitsubishi Denki Kabushiki Kaisha, Tokyo, Japan

[21] Appl. No.: 09/009,930

[22] Filed: Jan. 21, 1998

[30] Foreign Application Priority Data

Jul. 11, 1997 [JP] Japan .................................. 9-186604

[51] Int. Cl.[7] .................................................. G06F 9/455
[52] U.S. Cl. .............................. 395/500.36; 395/500.35; 395/500.07; 395/500.34
[58] Field of Search ........................ 395/500.36, 500.35, 395/500.37, 500.07, 500.43, 500.34

[56] References Cited

U.S. PATENT DOCUMENTS

| | | | |
|---|---|---|---|
| 5,630,100 | 5/1997 | Ganapathy et al. | 395/500.35 |
| 5,650,938 | 7/1997 | Bootehsaz et al. | 395/500.07 |
| 5,696,942 | 12/1997 | Palnitkar et al. | 395/500.35 |
| 5,790,836 | 8/1998 | Mizumo | 395/500.35 |

FOREIGN PATENT DOCUMENTS

07198791  8/1995  Japan .

OTHER PUBLICATIONS

Khoo, Kei–Yon; Willson, A. N., Jr.;"Cycle–based Timing Simulations Using Event–Streams", Prodeedings of the IEEE Interantional Conference on Computer Design: VLSI in Computers and Processors, pp. 460–465, Oct. 1996.

*Primary Examiner*—Kevin J. Teska
*Assistant Examiner*—Doug Sergent
*Attorney, Agent, or Firm*—McDermott, Will & Emery

[57] ABSTRACT

Where the output delay of a combinational circuit in a logic circuit is defined by a clock cycle count, data transfer means for outputting data delayed in the same number of clock cycles is inserted in a block of a cycle-based simulator. The data transfer means comprises registers or a combination of registers and selectors. The cycle-based simulator may be further arranged to automatically recognize the output delay of a combinational circuit in a target logic circuit. Data transfer means for effecting an output delay in the recognized number of clock cycles is then automatically inserted in a block of the cycle-based simulator.

10 Claims, 8 Drawing Sheets

LOGIC CIRCUIT SIMULATION APPARATUS HAVING CYCLE-BASED SIMULATOR FOR SIMULATING CIRCUITS INCLUDING MULTI-CYCLE PATHS

BACKGROUND OF THE INVENTION

1. Technical Field

The present invention relates to a logic circuit simulation apparatus and a logic verification method for use with a logic circuit. More particularly, the invention relates to a simulation apparatus and a logic verification method for use in designing a semiconductor integrated circuit.

2. Background Art

In developing semiconductor integrated circuits, the logic of target circuits are commonly checked before they are manufactured as semiconductor chips. One problem with such procedures is that as semiconductor integrated circuits grow in scale, it takes longer to verify their logic in the design stage. A cycle-based simulator capable of high-speed logic function verification has been attracting attention as a viable way to reduce the time required for logic verification. The cycle-based simulator is a simulator that runs without regard to signal delays on the assumption that every data transfer between registers is carried out in one clock cycle, thereby attaining rapid logic verification. A typical cycle-based simulator may be constructed on a program by a computer system. However, conventional cycle-based simulators are limited in the scope of applicable circuits. These simulators cannot be applied to circuits wherein multi-cycle paths exist, as will be discussed below.

In the cycle-based simulator, a block is extracted for each external connection output terminal and a register arrangement such that a combinational circuit is interposed for data transfer between every external connection input terminal and a register, between one register and another, between every external connection input terminal and every external connection output terminal, and between every external connection output terminal and a register. A combinational circuit is a circuit whose output is uniquely determined with respect to a combination of inputs. Combinational circuits are made of logic gates and selectors with no registers. A block is defined as a combination of a combinational circuit, an external connection input terminal(s) and/or a register(s) connected on the input side to that combinational circuit, and an external connection output terminal and/or a register connected on the output side to the circuit.

FIG. 1 is a partial schematic view of a circuit in which a block is extracted for each external connection output terminal and a register arrangement such that a combinational circuit is interposed for data transfer between every external connection input terminal and a register, between one register and another, between every external connection input terminal and every external connection output terminal, and between every external connection output terminal and a register. In FIG. 1, a circle represents a combinational circuit, a rectangle denotes a register, and a triangle indicates an external connection terminal. Every extracted block belongs to one of typical blocks shown in FIGS. 2 through 7.

FIG. 2 shows a block B1 extracted from the circuit of FIG. 1, wherein data from any external connection input terminal and from a register is transferred to a register REG2 solely through a combinational circuit CL1. In FIG. 2, the combinational circuit CL1 in the block B1 admits data from external connection input terminals IN1 and IN2, as well as an output from the register REG1, and forwards the circuit output as an input to the register REG2.

FIG. 3 shows a block B2 extracted from the circuit of FIG. 1, wherein data from at least one external connection input terminal is transferred to a register REG3 through combinational circuit CL2. In FIG. 3, the combinational circuit CL2 in the block B2 admits data from external connection input terminals IN3, IN4 and IN5, and forwards the circuit output as an input to the register REG3.

FIG. 4 shows a block B3 extracted from the circuit of FIG. 1, wherein data from at least one register is transferred to a register REG7 solely through a combinational circuit CL3. In FIG. 4, the combinational circuit CL3 in the block B3 receives data from registers REG4, REG5 and REG6, and forwards the circuit output as an input to the register REG7.

FIG. 5 shows a block B4 extracted from the circuit of FIG. 1, wherein data from any external connection input terminal and from registers is transferred to an external connection output terminal OUT1 through combinational circuit CL4. In FIG. 5, the combinational circuit CL4 in the block B4 admits data from an external connection input terminal IN5 and from registers REG8, REG9 and REG10, and forwards the circuit output to the external connection output terminal OUT1.

FIG. 6 shows a block B5 extracted from the circuit of FIG. 1, wherein data from any external connection input terminals is transferred to an external connection output terminal OUT2 through combinational circuit CL5. In FIG. 6, the combinational circuit CL5 in the block B5 admits data from external connection input terminals IN3, IN4 and IN6, and forwards the circuit output to the external connection output terminal OUT2.

FIG. 7 shows a block B6 extracted from the circuit of FIG. 1, wherein data from any registers is transferred to an external connection output terminal OUT3 through combinational circuit CL6. In FIG. 7, the combinational circuit CL6 admits data from registers REG8, REG11 and REG12, and forwards the circuit output to the external connection output terminal OUT3.

The cycle-based simulator simulates the circuits extracted as outlined above. With the simulator in operation, the data output of the combinational circuit in each block, and the outputs of registers connected to that circuit on its input side, are transferred without regard to signal delays to implement high-speed logic function verification. Hence, conventional cycle-based simulators are incapable of effecting accurate logic function verification if the output of the combinational circuit in each extracted block, and the outputs of registers connected to that circuit on its input side, are not guaranteed to be output within a delay of one clock cycle from the data input.

FIGS. 8 and 9 illustrate a circuit that may be simulated by a conventional cycle-based simulator under the constraint of one clock cycle delay. FIG. 8 shows, in terms of waveforms with respect to a clock signal, those outputs of the external connection input terminals IN1 and IN2 which are input to the combinational circuit CL1 in the block B1 in FIG. 2, the output of the register REG1 which is also input to the combinational circuit CL1, and the output of the combinational circuit CL1. FIG. 9 is a waveform chart that applies when the same signals shown in FIG. 8 are handled by a cycle-based simulator.

In FIG. 8, reference numeral T1 stands for the time duration of one clock cycle, T2 for a delay from the time the clock cycle is started until data is input from the external connection input terminal IN1, T3 for a delay from the time the clock cycle is started until data is input from the external connection input terminal IN2, and T4 for an output delay of the register REG1 following the clock input.

It takes another delay T5 for the output of the combinational circuit CL1 to be determined following the receipt of the inputs from the external connection input terminals IN1 and IN2, as well as of the output of the register REG1. Thus, the output delay for the combinational circuit CL1 in the first clock cycle is defined as T4+T5. The total delay from the time a clock cycle is changed until the output of the combinational circuit is determined is referred to as the output delay of the combinational circuit.

Further in FIG. 8, reference numeral T6 stands for the output delay of the combinational circuit CL1 in a second clock cycle, T7 for the output delay of the combinational circuit CL1 in a third clock cycle, and T8 for the output delay of the combinational circuit CL1 in a fourth clock cycle. In each of the clock cycles, the output delay of the combinational circuit CL1 does not exceed one clock cycle T1. This makes it possible to acquire the output results shown in FIG. 9, the same as those in FIG. 8, through the use of the conventional cycle-based simulator. In FIG. 9, all signals except a clock signal are changed in the middle of each clock cycle. This is to show that the cycle-based simulator is to change each signal in each clock cycle without regard to delays.

FIGS. 10 through 13 illustrate circuits to which conventional cycle-based simulators cannot be applied. FIGS. 10 and 12 show, in terms of waveforms with respect to the clock signal, those outputs of the external connection input terminals IN1 and IN2 which are input to the combinational circuit CL1 in the block B1 in FIG. 2, the output of the register REG1 which is also input to the combinational circuit CL1, and the output of the combinational circuit CL1. The internal structure of the combinational circuit CL1 and its workings are different from the setups of FIGS. 10 and 12. FIG. 11 represents a case in which the same signals shown in FIG. 10 are handled by a cycle-based simulator. FIG. 13 applies to a case wherein the same signals shown in FIG. 12 are handled by a cycle-based simulator.

In FIG. 10, reference numeral T9 stands for the output delay of the combinational circuit CL1 in the first clock cycle, and T10 for the output delay of the combinational circuit CL1 in the third clock cycle. That is, two clock cycles are required before the circuit output is determined. In such a case, using a conventional cycle-based simulator yields the results in FIG. 11 which differ from those in FIG. 10. This is because neither the first nor the third clock cycle fall within one clock cycle.

In FIG. 12, the output delay of the combinational circuit CL1 in the first clock cycle is T11, requiring one clock cycle before the circuit output is determined. The output delay of the combinational circuit CL1 in the second clock cycle is T12, requiring three clock cycles before the output is determined. In such cases, using a conventional cycle-based simulator yields the results in FIG. 13. While the output result in the first clock cycle that falls within one clock cycle in FIG. 13 is the same as that in FIG. 12, the result in the second clock cycle not effected within one clock cycle differs from that in FIG. 12.

Differences between the results of outputs from the individual blocks are enlarged further for the entire semiconductor integrated circuit. In FIGS. 11 and 13, all signals, except the clock signal, are changed in the middle of each clock cycle. This is to show that the cycle-based simulator is to change each signal in each clock cycle without regard to delays.

As explained with reference to FIGS. 10 and 12, a data transfer route of a combinational circuit that is activated when its output delay exceeds one clock cycle with respect to a combination of inputs is called a multi-cycle path. Circuits comprising such multi-cycle paths cannot be simulated by use of conventional cycle-based simulators.

SUMMARY OF THE INVENTION

It is therefore an object of the present invention to overcome the above and other disadvantages of the prior art and to provide an apparatus and a method for simulating or logically verifying circuits including multi-cycle paths by use of a cycle-based simulator.

According to one aspect of the present invention, a logic circuit simulation apparatus comprises a cycle-based simulator and data transfer means. If a combinational circuit of a logic circuit effects an output delayed by 1 to N clock cycles with respect to a combination of inputs to the combinational circuit, while N is an integer larger than 1, then the data transfer means is inserted in a block of the cycle-based simulator, while the block corresponds to the combinational circuit. Further, the data transfer means effects an output delayed by 1 to N clock cycles in accordance with the combination of inputs.

In the logic circuit simulation apparatus, the data transfer means comprises preferably at least one register means inserted in a path of the block, and selector means for selecting the register means in accordance with the combination of inputs.

In the logic circuit simulation apparatus, the register means transfers data preferably in one clock cycle.

In another aspect of the present invention, in the logic circuit simulation, if the combinational circuit of the logic circuit effects all outputs delayed by M clock cycles with respect to a combination of inputs to the combinational circuit, while M is an integer larger than 1 and smaller than N, then the data transfer means is inserted in the block of the cycle-based simulator, while the block corresponds to the combinational circuit. Further, the data transfer means effects all outputs delayed by M clock cycles in accordance with the combination of inputs.

In the logic circuit simulation apparatus, the data transfer means is preferably constituted by register means inserted in a path of the block.

In the logic circuit simulation apparatus, the data transfer means is constituted preferably by as many as M register means in cascaded connection, and each register means transfers data in one clock cycle.

Alternatively, in the logic circuit simulation apparatus, the data transfer means is constituted preferably by one register means which transfer data in M clock cycles.

In the logic circuit simulation apparatus, the data transfer means is preferably inserted in an output circuit or at least one input circuit of the combinational circuit within the block, or in at least one internal circuit.

According to another aspect of the present invention, a logic circuit simulation apparatus comprises a cycle-based simulator and data transfer means. When a combinational circuit of a target logic circuit has an output delayed by a designated clock cycle count with respect to a combination of inputs to the combinational circuit, then the data transfer means is inserted automatically in a block of the cycle-based simulator, while the block corresponds to the combinational circuit. Further, the data transfer means effects an output delayed by the designated clock cycle count.

According to another aspect of the present invention, a logic circuit simulation apparatus comprises a cycle-based simulator and data transfer means. By recognizing automatically an output delay of a combinational circuit of a target logic circuit in terms of a clock cycle count with respect to a combination of inputs to the combinational circuit, the data transfer means is inserted automatically in a block of the cycle-based simulator, while the block corresponds to the combinational circuit. Further, the data transfer means effects an output delayed by the recognized clock cycle count.

Other and further objects, features and advantages of the invention will appear more fully from the following description.

BEST MODE OF CARRYING OUT THE INVENTION

Figure 1:
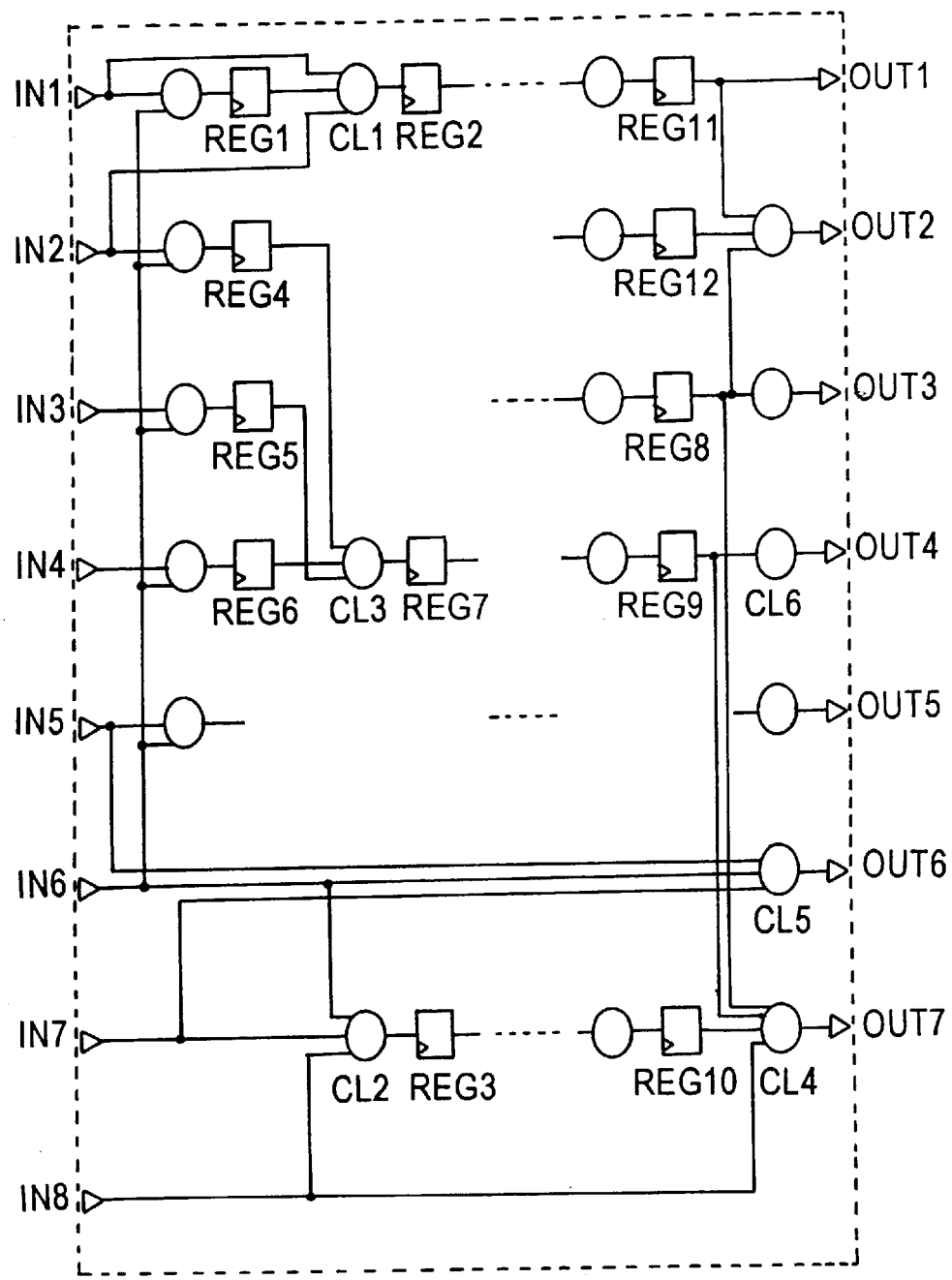
FIG. 1 is a partial schematic view of a circuit in which a block is extracted.

Preferred embodiments of the present invention will now be described with reference to the accompanying drawings, in which like reference characters designate like or corresponding parts.

First Embodiment

A first embodiment of the invention applies where the output delay of a combinational circuit including a multi-cycle path in a logic circuit remains constant with respect to different combinations of inputs to that combinational circuit. The first embodiment works as follows: as shown in FIG. 1, a block is first extracted from a semiconductor integrated circuit targeted for logic verification. Then, a clock cycle count of the output delay for the block is designated for all multi-cycle paths. A fixed clock cycle count of the output delay is designated for each combination of inputs to every combinational circuit comprising a multi-cycle path.

Suppose that the output delay of a combinational circuit in a given block of the target logic circuit is designated as M clock cycles (M is an integer greater than 1) for all combinations of inputs. In that case, M-1 registers constituting data transfer means are automatically inserted in the output of a combinational circuit in a simulator. Here, the inserted registers are enabled only during simulation, and the actual circuit is not modified. Data output from the combinational circuit is transferred to the M-1 inserted registers.

Figure 14:
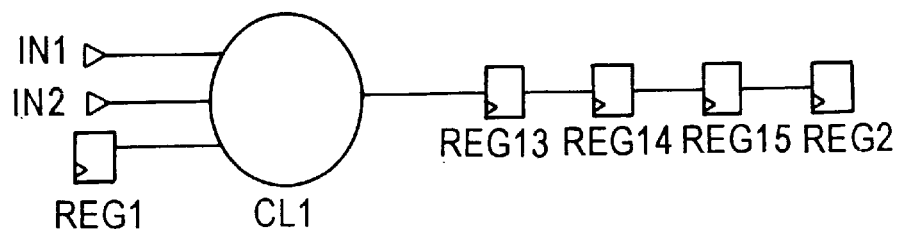
FIG. 14 illustrates an example of a circuit in which registers are inserted in a block as data transfer means according to a first embodiment of the present invention.

The first embodiment will be further described below in connection with the block B1 in FIG. 2. The combinational circuit CL1 (in the block B1 of FIG. 2) receives inputs from the external connection input terminals IN1 and IN2, as well as from the register REG1, and forwards the circuit output as an input to the register REG2. Because the combinational circuit CL1 is a three-input one-output combinational circuit, it has a total of eight combinations of inputs. If the output delay of the combinational circuit CL1 is designated as four clock cycles for each of the eight combinations of inputs, then three registers REG13, REG14 and REG15 constituting data transfer means are inserted serially between the combinational circuit CL1 and the register REG2. FIG. 14 illustrates how the registers REG13, REG14 and REG15 are inserted interposingly between the combinational circuit CL1 and the register REG2 in the block B1.

Data input to the combinational circuit CL1 in a given clock cycle is transferred to the register REG13 one clock cycle later, to the register REG14 two clock cycles later, to the register REG15 three clock cycles later, and to the register REG2 four clock cycles later. Since data is supposed to reach the register REG2 four clock cycles after the input, the desired result is thus obtained. With the three registers inserted for data transfer purposes, all data input to the combinational circuit CL1 reaches the register REG2 in four clock cycles. This means that the cycle-based simulator can simulate a combinational circuit whose output delay is designated as four clock cycles regarding all combinations of inputs. Generally, where the output delay of a combinational circuit is N clock cycles, data is transferred through the use of N-1 inserted registers.

The processing described above may be implemented on all extracted blocks such as those in FIGS. 2 through 7 in the semiconductor integrated circuit. Where the semiconductor integrated circuit comprises multi-cycle paths, processing may be applied to individual combinational circuits as long as the output delay of any one of the combinational circuits (including multi-cycle paths) is M (1<M) clock cycles relative to all combinations of inputs.

The clock cycle count M for a multi-cycle path need only be the same for any one combinational circuit. In other words, the clock cycle count need not be the same for all multi-cycle paths in the semiconductor integrated circuit. Specifically, where the output delay of the combinational circuit CL1 in the block B1 is four clock cycles, and the output delay of the combinational circuit CL2 in the block B2 is two clock cycles, three registers are to be inserted in the block B1 and one register in the block B2.

Where the output delay of a combinational circuit (including a multi-cycle path) is M (1<M) clock cycles for all combinations of inputs, M-1 registers are inserted in the output of that combinational circuit. This allows a cycle-based simulator to implement a simulation apparatus applicable to a logic circuit comprising multi-cycle paths.

Second Embodiment

A second embodiment of the invention applies to a logic circuit in which the output delay of a combinational circuit comprising a multi-cycle path is made of different clock cycle counts for different combinations of inputs. In the first embodiment, the output delay of any one combinational circuit comprising a multi-cycle path is assigned M clock cycles (M is an integer larger than 1) for all combinations of inputs. In the second embodiment, on the other hand, the output delay of a combinational circuit (including a multi-cycle path) is not fixed to N clock cycles for all combinations of inputs. That is, the output delay may vary from 1 to N clock cycles regarding different input combinations.

The second embodiment will now be described. As in the case of the first embodiment, a block is first extracted from a semiconductor integrated circuit targeted for logic verification, as illustrated in FIG. 1. Then clock cycle counts of the output delay for the block are designated for all multi-cycle paths. Suppose that the output delay of a combinational circuit in a given block of the target logic circuit is designated as 1 to N clock cycles (N is an integer greater than 1) for all combinations of inputs. In that case, N-1 registers and N-1 selectors constituting data transfer means are automatically inserted in the output of a combinational circuit in a simulator. The inserted registers and selectors are enabled only during simulation, and the actual circuit is not modified. Where the output delay of the combinational circuit is made of M clock cycles ($1 \leq M \leq N$) for a given combination of inputs, data output from the combinational circuit is transferred to M-1 inserted registers.

Figure 15:
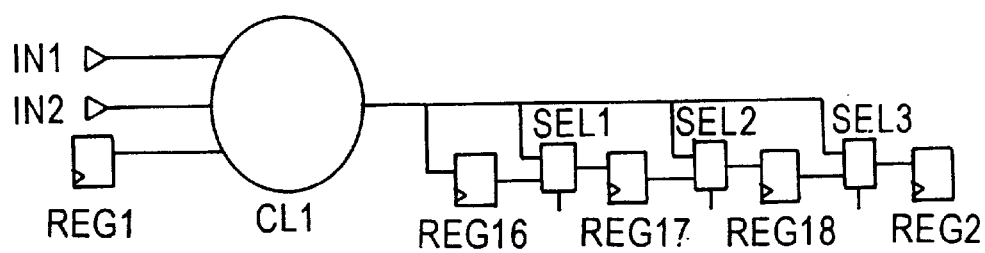
FIG. 15 illustrates another example of a circuit in which registers and selectors are inserted in a block as data transfer means according to a second embodiment of the present invention.

The second embodiment will be further described below in connection with the block B1 in FIG. 2. It is assumed here that the internal structure of the combinational circuit CL1 in the block B1, or the workings of that circuit, are different from those in the first embodiment. The combinational circuit CL1 in the block B1 of FIG. 2 receives inputs from the external connection input terminals IN1 and IN2, as well as from the register REG1, and forwards the circuit output as an input to the register REG2. With its three inputs and one output, the combinational circuit CL1 has a total of eight combinations of inputs. If the output delay of the combinational circuit CL1 is designated as one to four clock cycles for the eight combinations of inputs, then three registers REG16, REG17 and REG18 and three selectors SEL1, SEL2 and SEL3 constituting data transfer means are inserted between the combinational circuit CL1 and the register REG2. FIG. 15 illustrates how the registers REG16, REG17 and REG18 and the selectors SEL1, SEL2 and SEL3 are inserted interposingly between the combinational circuit CL1 and the register REG2 in the block B1.

In a given clock cycle, data is input to the combinational circuit CL1 in combinations constituting an output delay of four clock cycles. In that case, the selectors SEL1, SEL2 and SEL3 are set to select the outputs of the registers REG16, REG17 and REG18, respectively. The data input to the combinational circuit CL1 is transferred to the register REG16 one clock cycle later, to the register REG17 two clock cycles later, to the register REG18 three clock cycles later, and to the register REG2 four clock cycles later. Since the data is supposed to reach the register REG2 four clock cycles after the input, the desired result is obtained.

In another given clock cycle, data is input to the combinational circuit CL1 in combinations constituting an output delay of three clock cycles. In that case, the selector SEL1 is set to select the output of the combinational circuit CL1, and the selectors SEL2 and SEL3 are set to select the outputs of the registers REG17 and REG18, respectively. The data input to the combinational circuit CL1 is transferred to the register REG17 one clock cycle later, to the register REG18 two clock cycles later, and to the register REG2 three clock cycles later. Since the data is supposed to reach the register REG2 three clock cycles after the input, the desired result is obtained.

In yet another given clock cycle, data is input to the combinational circuit CL1 in combinations constituting an output delay of two clock cycles. In such a case, the selectors SEL2 and SEL3 are set to select the output of the combinational circuit CL1 and that of the register REG18, respectively. The data input to the combinational circuit CL1 is transferred to the register REG18 one clock cycle later, and to the register REG2 two clock cycles later. Since the data is supposed to reach the register REG2 two clock cycles after the input, the desired result is obtained.

In another given clock cycle, data is input to the combinational circuit CL1 in combinations constituting an output delay of one clock cycle. In such a case, the selector SEL3 is set to select the output of the combinational circuit CL1. The data input to the combinational circuit CL1 is transferred to the register REG2 one clock cycle later. Since the data is supposed to reach the register REG2 one clock cycle after the input, the desired result is obtained.

In the cycle-based simulator, as described, the number of registers inserted for data transfer purposes is varied from 0 to 3, depending on the number of clock cycles constituting the output delay of any one combinational circuit. The data input to the combinational circuit CL1 is transferred during the desired clock cycles to the register REG2. This makes it possible for the cycle-based simulator to implement a combinational circuit whose output delay is designated as 1 to 4 clock cycles for the combinations of inputs to that circuit.

Generally, where the output delay of a given combinational circuit amounts to a maximum of N clock cycles, all N-1 inserted registers are used for data transfer. One register is removed every time the number of clock cycles constituting the output delay is decremented by 1. When the output delay is down to one clock cycle, i.e., to the minimum clock cycle count, data is transferred without the use of the inserted registers.

Processing may be implemented on all extracted blocks, such as those in FIGS. 2 through 7 in the semiconductor integrated circuit. Where the semiconductor integrated circuit comprises multi-cycle paths, processing may be applied to individual combinational circuits as long as the output delay of any one of the combinational circuits comprising multi-cycle paths varies from 1 to N (1<N) clock cycles relative to all combinations of inputs.

The maximum clock cycle count N for a multi-cycle path need only be designated for each of individual combinational circuits. There is no need to specify the same number of clock cycles for all combinational circuits comprising multi-cycle paths in the semiconductor integrated circuit. Specifically, for the combinational circuit CL1 with its output delay ranging from 1 to 4 clock cycles inside the block B1, three registers and three selectors may be inserted in the block B1. The combinational circuit CL2 having its output delay ranging from 1 to 2 clock cycles inside the block B2, one register and one selector may be inserted in the block B2.

As described, where the output delay of a combinational circuit including a multi-cycle path is 1 to N (1<N) clock cycles for all combinations of inputs, N-1 registers and N-1 selectors are inserted in the output of that combinational circuit. Necessary numbers of inserted registers and selectors are then activated depending on the output delay of the combinational circuit. In this manner, the cycle-based simulator may implement a simulation apparatus applicable to a logic circuit comprising multi-cycle paths.

Third Embodiment

A third embodiment of the invention applies to cases where the positions of registers or selectors inserted in a given block of a simulation apparatus are varied. The first and second embodiments have registers or a combination of registers and selectors inserted solely on the output side of a combinational circuit. The third embodiment, on the other hand, envisages inserting, where desired inside the combinational circuit or on the input side thereof, registers or a combination of registers and selectors constituting data transfer means. The arrangement of inserted registers and selectors described in the third embodiment will still implement a simulation apparatus applicable to a circuit comprising multi-cycle paths by use of a cycle-based simulator.

Figure 2:
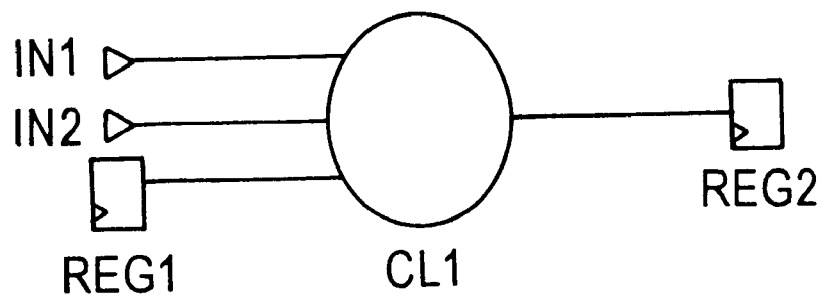
FIGS. 2 to 7 show each block extracted from the circuit of FIG. 1.
Figure 3:
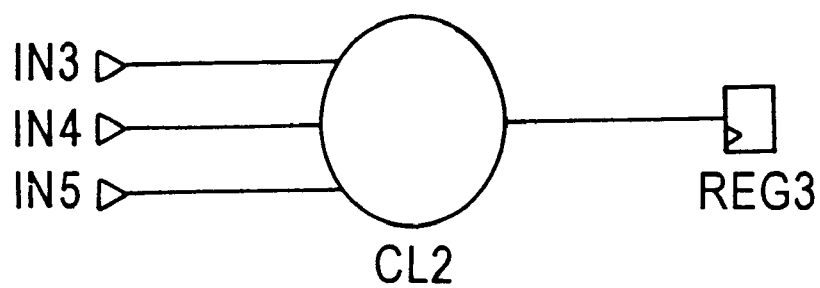
Figure 4:
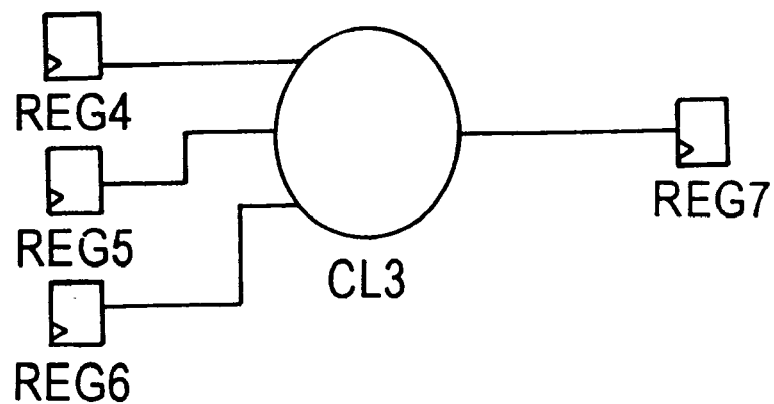
Figure 5:
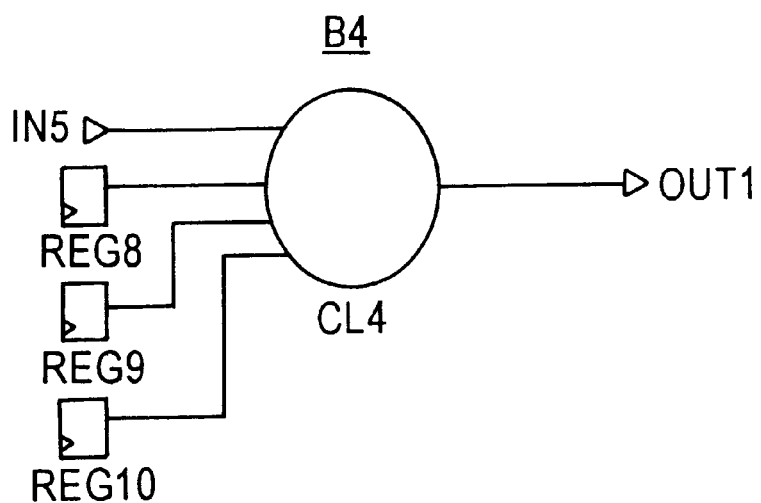
Figure 6:
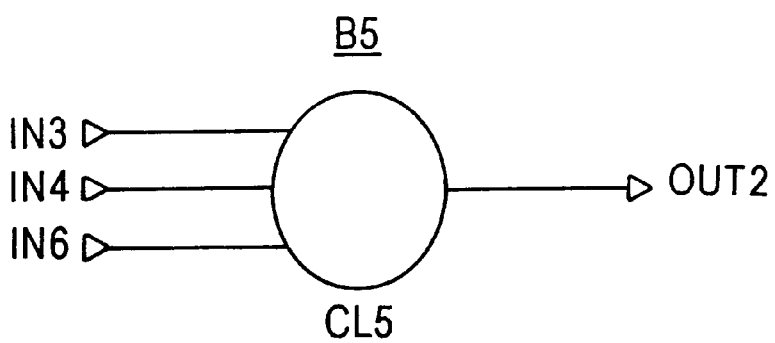
Figure 7:
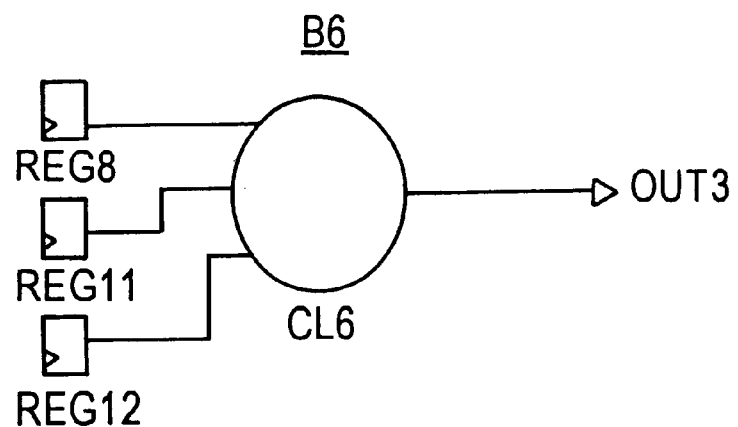
Figure 8:
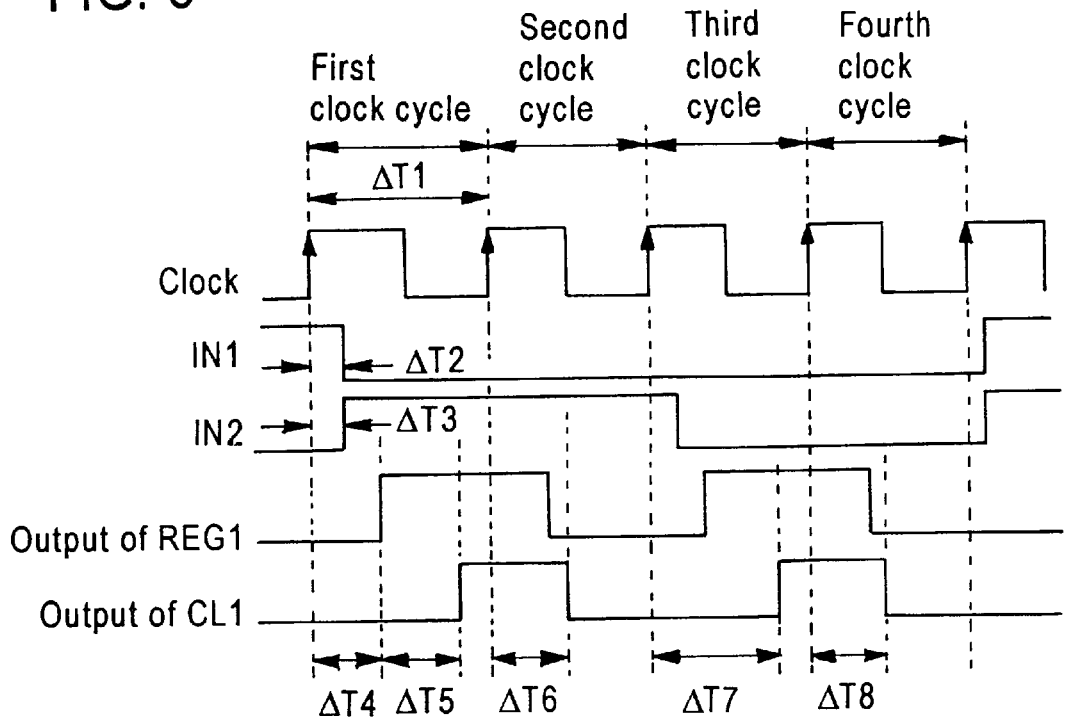
FIG. 8 shows waveforms with respect to a clock signal of a circuit that may be simulated by a conventional cycle-based simulator.
Figure 9:
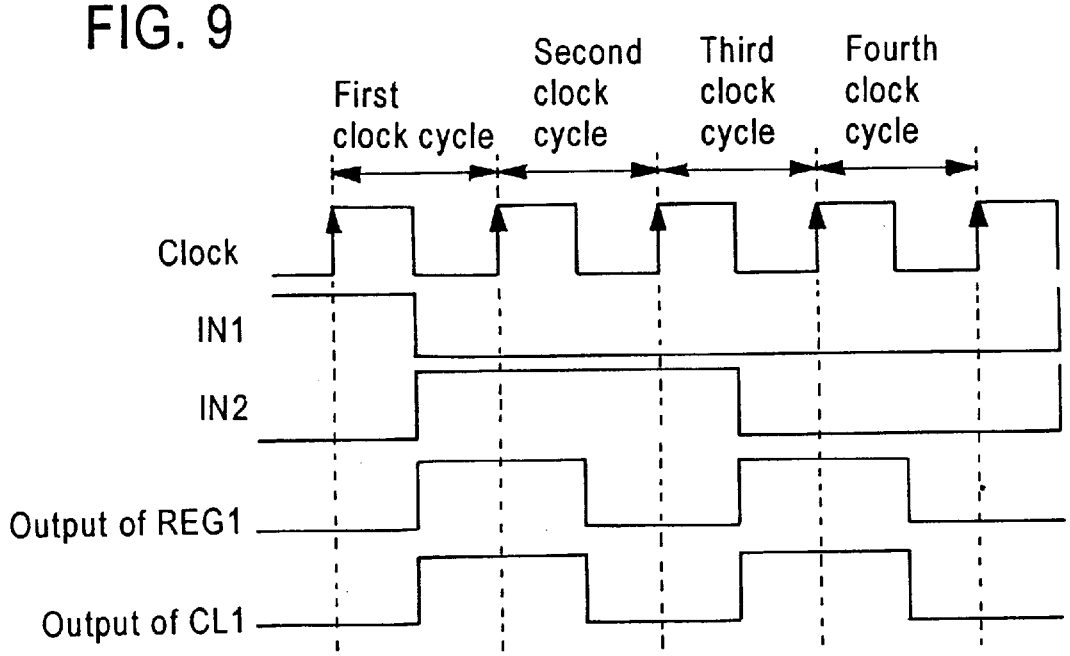
FIG. 9 is a waveform chart that applies when the same signals shown in FIG. 8 are handled typically by a cycle-based simulator.
Figure 10:
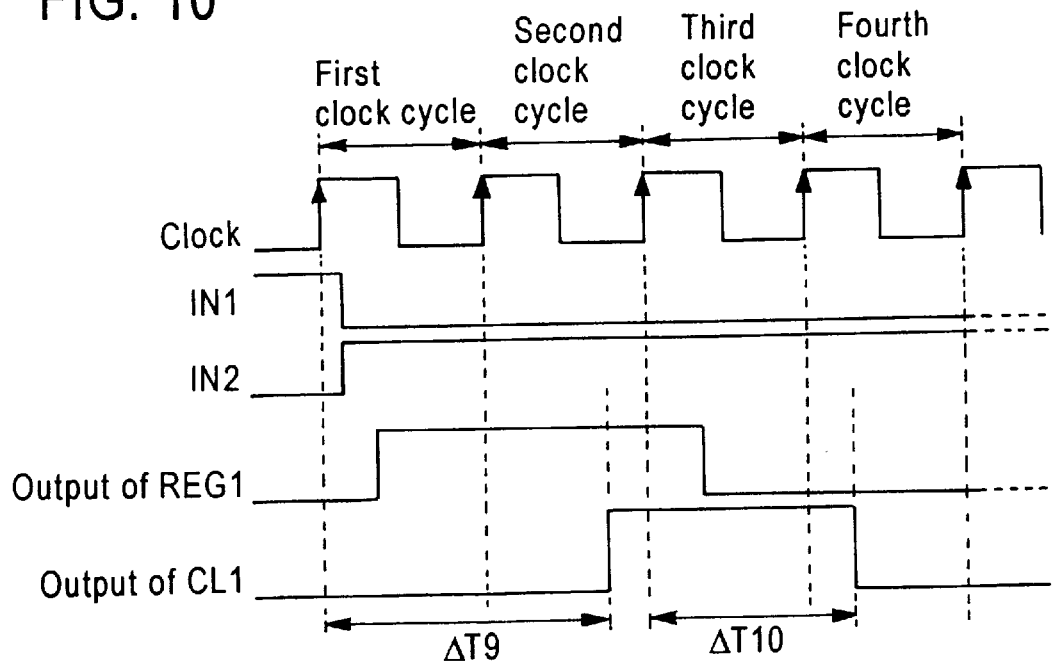
FIG. 10 shows waveforms with respect to the clock signal of a circuit that works in N clock cycles.
Figure 11:
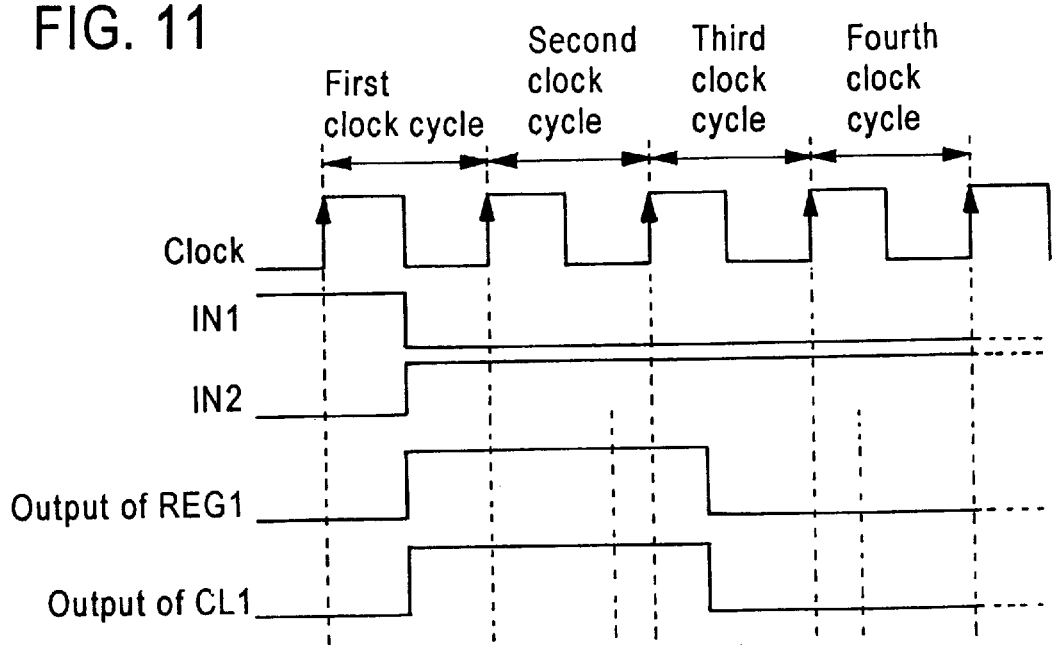
FIG. 11 represents a waveforms when the same signals shown in FIG. 10 are handled by a cycle-based simulator.
Figure 12:
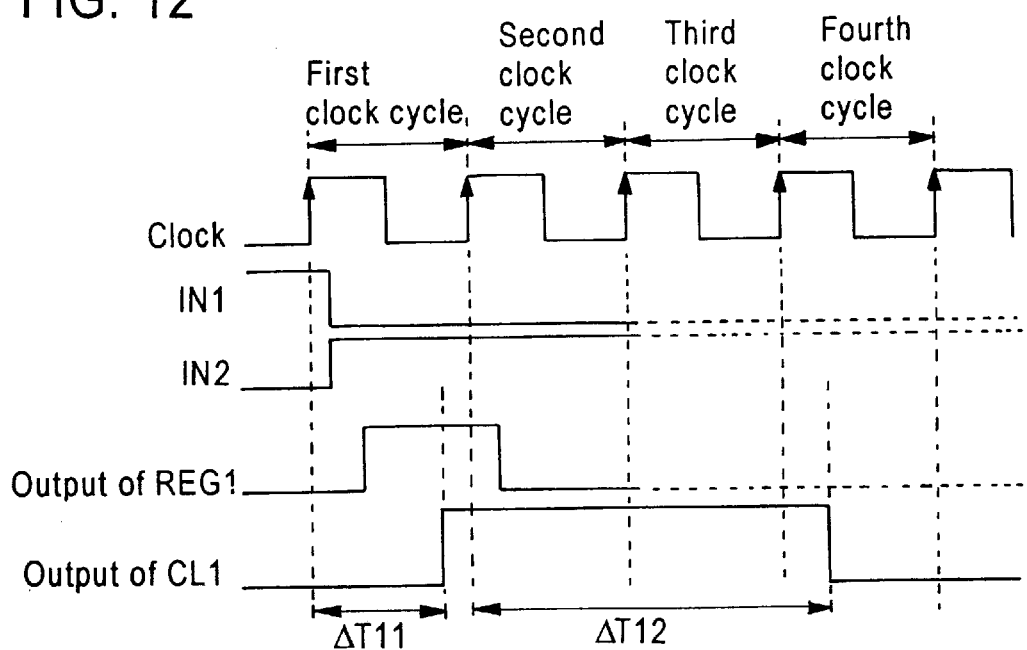
FIG. 12 shows waveforms with respect to the clock signal of another circuit that works in 1–N clock cycles.
Figure 13:
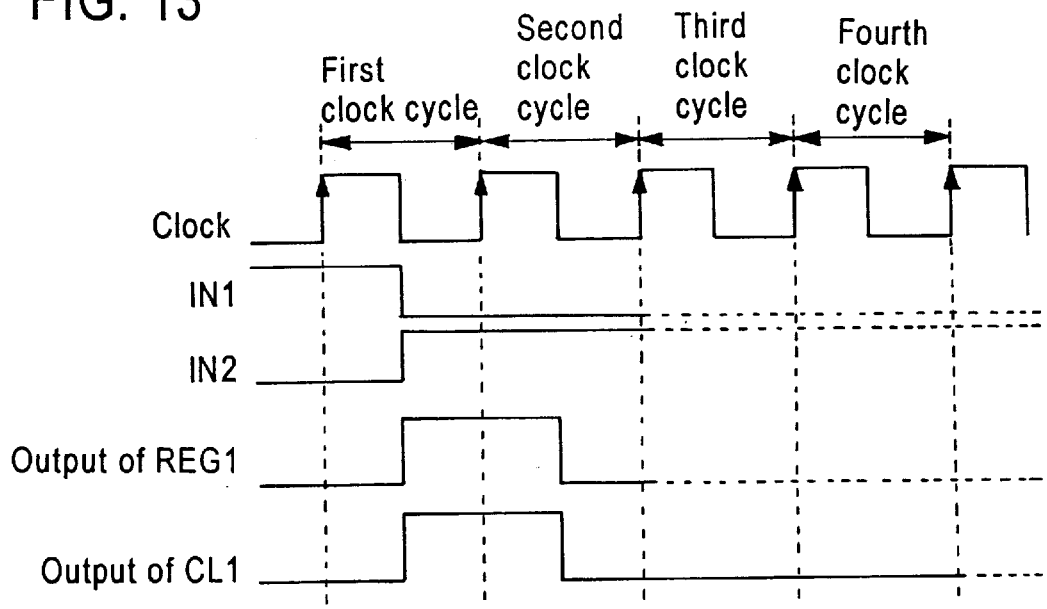
FIG. 13 represents a waveforms when the same signals shown in FIG. 12 are handled by a cycle-based simulator.
Figure 16:
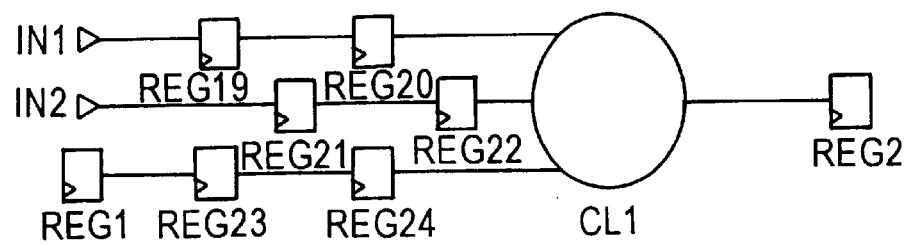
FIG. 16 illustrates another example of a circuit in which registers are inserted in a block as data transfer means according to a third embodiment of the present invention.
Figure 17:
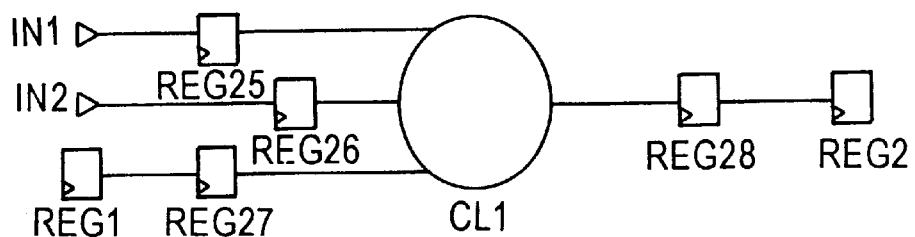
FIG. 17 illustrates another example of a circuit in which registers are inserted in a block as data transfer means according to a third embodiment of the present invention.
Figure 18:
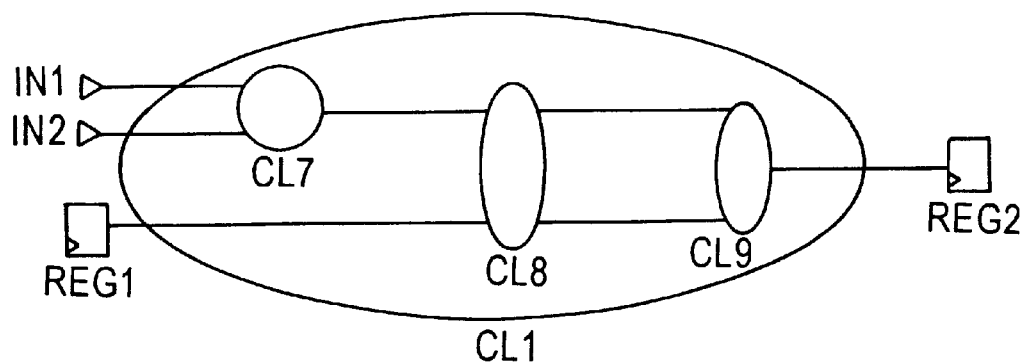
FIG. 18 illustrates another example of a circuit in which a combinational circuit is divided into partial combinational circuits according to a third embodiment of the present invention.
Figure 19:
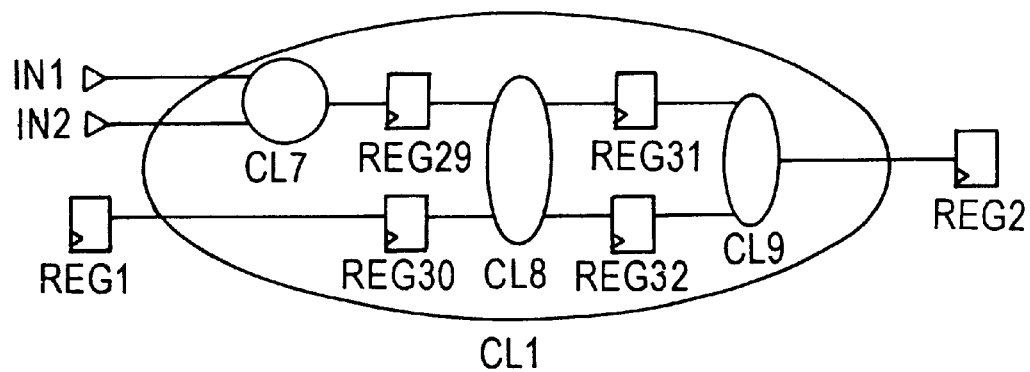
FIG. 19 illustrates another example of a circuit in which registers are inserted in a combinational circuit according to a third embodiment of the present invention.

FIG. 16 shows registers inserted on the input side of the combinational circuit CL1 when the output delay of the combinational circuit CL1 in the block B1 of FIG. 2 is three clock cycles. FIG. 17 illustrates registers inserted on both the input and the output side of the combinational circuit CL1, wherein the combinational circuit CL1 has the same output delay. FIGS. 18 and 19 depict cases in which registers are inserted wherever desired inside the combinational circuit CL1.

In FIG. 16, registers REG19 and REG20 (constituting data transfer means) transfer data from the external connection input terminal IN1 to the combinational circuit CL1 in two clock cycles. Registers REG21 and REG22 transfer data from the external connection input terminal IN2 to the combinational circuit CL1 in two clock cycles. Registers REG23 and REG24 transfer data from the register REG1 to the combinational circuit CL1 also in two clock cycles. The data output from the registers REG20, REG22 and REG24 are transferred to the combinational circuit CL1 two clock cycles after their input, and reach the register REG2 three clock cycles later. In this manner, the cycle-based simulator implements a combinational circuit whose output delay is made of three clock cycles.

In FIG. 17, a register REG25 admits data from the external connection input terminal IN1, and transfers the data to the combinational circuit CL one clock cycle later. A register REG26 receives data from the external connection input terminal IN2, and transfers the data to the combinational circuit CL1 one clock cycle later. A register REG27 is given data from the register REG1, and transfers the received data to the combinational circuit CL1 one clock cycle later. The data output from the registers REG25, REG26 and REG27 are forwarded to the combinational circuit CL1 one clock cycle after their input, reach the register REG28 two clock cycles later, and get to the register REG2 three clock cycles later. In this manner, the cycle-based simulator implements a combinational circuit whose output delay is three clock cycles.

In FIG. 18, the combinational circuit CL1 is divided into combinational circuits CL7, CL8 and CL9 in such a way that their output delays fall within one clock cycle. FIG. 19 shows a setup in which the divided combinational circuits CL7, CL8 and CL9 are arranged together with inserted registers REG29, REG30, REG31 and REG32 so that every data transfer from the input to the output of the combinational circuit CL1 will pass through two registers therein.

In FIG. 19, the register REG29 receives data from the external connection input terminals IN1 and IN2 via the combinational circuit CL7 and transfers the received data to the combinational circuit CL8 one clock cycle later. The register REG30 admits data from the register REG1 and transfers the data to the combinational circuit CL8 one clock cycle later. The registers REG31 and REG32 receive data from the registers REG29 and REG30 via the combinational circuit CL8 and transfer the received data to the combinational circuit CL9 two clock cycles later. The data from the registers REG31 and REG32 are input to the combinational circuit CL9 two clock cycles later and transferred to the register REG2 three clock cycles later. In this manner, the cycle-based simulator also implements a combinational circuit whose output delay is three clock cycles.

The third embodiment, as described above, has registers or a combination of registers and selectors inserted where desired within a block, i.e., on the output or input side of the combinational circuits as well as therewithin. This makes it possible for the cycle-based simulator to implement a simulation apparatus applicable to a logic circuit comprising multi-cycle paths.

Fourth Embodiment

A fourth embodiment of the invention is a logic circuit simulation apparatus, as well as a logic verification method implemented by use of a combination of the first through the third embodiments described above. Concurrently implementing the three preceding embodiments constitutes a cycle-based simulator that applies to any embodiment when the output delay of a combinational circuit (comprising a multi-cycle path) is M clock cycles (1<M) for all combinations of inputs, or when the output delay of a combinational circuit including a multi-cycle path is 1 to N clock cycles (1<N) for the combinations of inputs. That is, the fourth embodiment based on a cycle-based simulator implements a simulation apparatus that applies to any logic circuits comprising multi-cycle paths, particularly semiconductor integrated circuits. Needless to say, the cycle-based simulator of the fourth embodiment is also applicable to logic circuits with no multi-cycle paths included therein, particularly semiconductor integrated circuits.

In short, the output delay of any one combinational circuit in a target logic circuit is designated in terms of a clock cycle count. The block in a cycle-based simulator corresponding to the combinational circuit in question is arranged to effect an output delayed by the designated number of clock cycles. This amounts to a logic verification method for logically verifying the target logic circuit, and a simulation apparatus for use with that verification method. That is, given whatever multi-cycle path that may exist in the target circuit, the fourth embodiment allows a desired clock cycle count to be designated for that path. This constitutes a cycle-based simulator for logic verification, reproducing data transfers in the same number of clock cycles as the designated clock count within a simulator block corresponding to the multi-cycle path in question.

The embodiments described so far may be summarized as follows: where a specific path of a logic circuit is known as a multi-cycle path, a necessary cycle count is designated for that path. With a cycle-based simulator applied to that logic circuit for logic function verification, a register arrangement or a register-selector arrangement constituting data transfer means is inserted in the paths with registers constituting the multi-cycle path in the simulator. For verification, a signal is introduced into the multi-cycle path of the simulator. In the necessary number of clock cycles, the signal is transferred through the inserted register(s) making up the data transfer means so that every path between any two adjacent registers in the multi-cycle path is activated in one cycle. In this manner, the cycle-based simulator may implement a simulation apparatus applicable to a circuit comprising multi-cycle paths.

Fifth Embodiment

A fifth embodiment of the invention constitutes a logic verification method for automatically recognizing a multi-cycle path and its clock cycle count in a target logic circuit, and a simulation apparatus for use with that method. The first through the fourth embodiments above allow an external entity to designate a multi-cycle path and its clock cycle count at simulation time. The fifth embodiment, on the other hand, automatically recognizes a multi-cycle path and its clock cycle count in a target circuit, such as a semiconductor integrated circuit. This implements a cycle-based simulator applicable to a circuit (comprising multi-cycle paths) without recourse to externally initiated designation of a clock cycle count.

Since the cycle-based simulator is generally implemented by a computer system executing program, it should be easy to carry out the above processing where appropriate programs are provided. For example, performing static timing verification makes it possible to automatically extract a multi-cycle path and its cycle count from a logic circuit.

In short, the fifth embodiment (in the form of a logic verification method) runs on a suitable simulation apparatus which automatically recognizes the output delay, in a clock cycle count, of a combinational circuit in a target logic circuit for a combination of inputs, such that a cycle-based simulator block corresponding to the combinational circuit will automatically effect an output delayed in the recognized number of clock cycles for logic circuit verification. Given whatever multi-cycle path may exist in the target circuit, the simulator automatically recognizes that multi-cycle path and the clock cycle count associated with that path. Data transfers are then reproduced by the cycle-based simulator in the block corresponding to the automatically recognized multi-cycle path for logic verification.

The effects and advantages of the present invention are summarized as follows.

As described and according to the present invention, where the output delay of a combinational circuit in a logic circuit is defined by a clock cycle count, data transfer means for outputting data delayed in the same number of clock cycles is inserted in a block of a cycle-based simulator. These arrangements constitute a simulation apparatus for logically verifying the logic circuit comprising multi-cycle paths through the use of a cycle-based simulator.

According to the present invention, where the output delay of a combinational circuit in a target logic circuit is designated in terms of a clock cycle count, data transfer means for outputting data delayed in the designated number of clock cycles is inserted automatically in a block of a cycle-based simulator. These arrangements also constitute a simulation apparatus for logically verifying the logic circuit comprising multi-cycle paths through the use of a cycle-based simulator.

Also according to the present invention, the output delay of a combinational circuit in a target logic circuit is recognized automatically in terms of a clock cycle count, so that data transfer means for effecting an output delayed in the recognized number of clock cycles is automatically inserted in a block of a cycle-based simulator. These arrangements make up a simulation apparatus for logically verifying the logic circuit comprising multi-cycle paths through the use of a cycle-based simulator.

According to the present invention, where the output delay of a combinational circuit in a target logic circuit is designated in terms of a clock cycle count, a block of a cycle-based simulator is made so as to effect an output delayed in the designated number of clock cycles. The arrangements constitute a logic verification method for logically verifying logic circuits.

Further according to the present invention, arrangements are made so as to automatically recognize, by a clock cycle count, the output delay of a combinational circuit in a target logic circuit. A block of a cycle-based simulator is then arranged to effect an output delayed in the automatically recognized number of clock cycles. The arrangements also constitute a logic verification method for logically verifying logic circuits.

Further, for reference, the logic verification method for use with a logic circuit according to the present invention may be summarized as follows.

In one aspect of the present invention, in a logic verification method for use with a logic circuit, when an output delay of a combinational circuit of a target logic circuit is designated in terms of a clock cycle count with respect to a combination of inputs to the combinational circuit, then a block of a cycle-based simulator is made to effect an output delayed by the designated clock cycle count in order to verify the logic of the target logic circuit, while the block corresponds to the combinational circuit.

In another aspect of the present invention, in a logic verification method for use with a logic circuit, by recognizing automatically an output delay of a combinational circuit of a target logic circuit in terms of a clock cycle count with respect to a combination of inputs to the combinational circuit, then a block of a cycle-based simulator is made to effect an output delayed automatically by the recognized clock cycle count in order to verify the logic of the target logic circuit, while the block corresponds to the combinational circuit.

Obviously many modifications and variations of the present invention are possible in the light of the above teachings. It is therefore to be understood that within the scope of the appended claims the invention may by practiced otherwise than as specifically described.

What is claimed is:

1. A logic circuit simulation apparatus comprising a cycle-based simulator and data transfer means, said data transfer means is inserted in a block of said cycle-based simulator corresponding to a combinational circuit, and said data transfer means effects an output delayed by 1 to N clock cycles in accordance with a combination of inputs, if said combinational circuit of a logic circuit effects an output delayed by 1 to N clock cycles with respect to said combination of inputs to said combinational circuit, N being an integer larger than 1.

2. A logic circuit simulation apparatus according to claim 1, wherein said data transfer means comprises at least one register means inserted in a path of said block, and selector means for selecting said register means in accordance with said combination of inputs.

3. A logic circuit simulation apparatus according to claim 2, wherein said register means transfers data in one clock cycle.

4. A logic circuit simulation apparatus according to claim 1, wherein if said combinational circuit of said logic circuit effects all outputs delayed by M clock cycles with respect to a combination of inputs to said combinational circuit, M being an integer larger than 1 and smaller than N, then said data transfer means is inserted in said block of said cycle-based simulator, said block corresponding to said combinational circuit, said data transfer means effecting all outputs delayed by M clock cycles in accordance with said combination of inputs.

5. A logic circuit simulation apparatus according to claim 4, wherein said data transfer means is constituted by register means inserted in a path of said block.

6. A logic circuit simulation apparatus according to claim 5, wherein said data transfer means is constituted by as many as M register means in cascaded connection, each register means transferring data in one clock cycle.

7. A logic circuit simulation apparatus according to claim 5, wherein said data transfer means is constituted by one register means which transfer data in M clock cycles.

8. A logic circuit simulation apparatus according to claim 1, wherein said data transfer means is inserted in an output circuit or at least one input circuit of said combinational circuit within said block, or in at least one internal circuit.

9. A logic circuit simulation apparatus comprising a cycle-based simulator and data transfer means, wherein, when a combinational circuit of a target logic circuit has an output delayed by a designated clock cycle count with respect to a combination of inputs to said combinational circuit, then said data transfer means is inserted automatically in a block of said cycle-based simulator, said block corresponding to said combinational circuit, said data transfer means effecting an output delayed by said designated clock cycle count.

10. A logic circuit simulation apparatus comprising a cycle-based simulator and data transfer means, said data transfer means is automatically inserted in a block of said cycle-based simulator corresponding to a combinational circuit, and said data transfer means effects an output delayed by a clock cycle count, by automatically recognizing an output delay of said combinational circuit of a target logic circuit in terms of said clock cycle count with respect to said combination of inputs to said combinational circuit.

* * * * *